US010481225B2

(12) United States Patent
Nistler et al.

(10) Patent No.: US 10,481,225 B2
(45) Date of Patent: Nov. 19, 2019

(54) METHOD AND DEVICE FOR CHECKING BODY COIL OF MAGNETIC RESONANCE IMAGING SYSTEM

(71) Applicant: Siemens Healthcare GmbH, Erlangen (DE)

(72) Inventors: Juergen Nistler, Erlangen (DE); Yu Tang, Shenzhen (CN); JianMin Wang, Shenzhen (CN); Zhi Gen Yang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 385 days.

(21) Appl. No.: 15/086,851

(22) Filed: Mar. 31, 2016

(65) Prior Publication Data

US 2016/0291101 A1    Oct. 6, 2016

(30) Foreign Application Priority Data

Mar. 31, 2015   (CN) .......................... 2015 1 0147816

(51) Int. Cl.
*G07C 9/00* (2006.01)
*G01R 33/36* (2006.01)
*G01R 33/34* (2006.01)

(52) U.S. Cl.
CPC ........ *G01R 33/36* (2013.01); *G01R 33/34046* (2013.01)

(58) Field of Classification Search
CPC .............. G01R 33/3415; G01R 33/543; G01R 33/5659; G01R 33/36; G01R 33/3875
USPC ....................................................... 324/307
See application file for complete search history.

(56) References Cited

U.S. PATENT DOCUMENTS

| | | | | |
|---|---|---|---|---|
| 4,820,985 A * | 4/1989 | Eash | ................ | G01R 33/34046 324/318 |
| 5,432,449 A * | 7/1995 | Ferut | ...................... | G01R 33/58 324/318 |
| 5,551,430 A * | 9/1996 | Blakeley | .............. | A61B 5/0555 324/318 |
| 5,684,400 A * | 11/1997 | Tsukamoto | .......... | G01R 33/561 324/307 |
| RE36,495 E * | 1/2000 | Blakeley | .............. | A61B 5/0555 324/318 |
| 7,088,098 B1 * | 8/2006 | Lynch | ................ | G01R 33/3628 324/307 |
| 7,173,423 B2 * | 2/2007 | Buchwald | .......... | H04B 10/2575 324/318 |

(Continued)

OTHER PUBLICATIONS

Savukov, I., and T. Karaulanov. "Anatomical MRI with an atomic magnetometer." Journal of Magnetic Resonance 231 (2013): 39-45.*

*Primary Examiner* — Christopher P McAndrew
(74) *Attorney, Agent, or Firm* — Schiff Hardin LLP

(57) ABSTRACT

In a method and device for checking a body coil of an MRI system a current value of one or more parameters of the MRI system is acquired under a specific condition. The current value is compared with a reference value of the parameter to obtain a comparison result. A state of the body coil is determined according to the comparison result. The method for checking a body coil of an MRI system according to a particular embodiment of the present invention can replace onsite periodic maintenance inspection by a maintenance engineer, and also detect damage to the body coil at an early stage.

8 Claims, 2 Drawing Sheets

(56) References Cited

U.S. PATENT DOCUMENTS

| | | | | |
|---|---|---|---|---|
| 7,598,737 B2* | 10/2009 | Campagna | G01R 33/3415 | 324/307 |
| 7,622,920 B2* | 11/2009 | Machida | G01R 33/3415 | 324/307 |
| 7,626,385 B2* | 12/2009 | Yokoi | G16H 40/40 | 324/307 |
| 7,663,364 B2* | 2/2010 | Takai | G01R 33/3621 | 324/307 |
| 8,049,501 B2* | 11/2011 | Hancu | G01R 33/34061 | 324/318 |
| 8,301,243 B2* | 10/2012 | Stevenson | A61B 5/04 | 607/2 |
| 8,633,706 B2* | 1/2014 | Possanzini | G01R 33/58 | 324/537 |
| 9,482,728 B2* | 11/2016 | Bottomley | G01R 33/285 | |
| 9,835,704 B2* | 12/2017 | Yamamoto | A61B 5/055 | |
| 2005/0062472 A1* | 3/2005 | Bottomley | G01R 33/34046 | 324/317 |
| 2007/0103157 A1* | 5/2007 | Campagna | A61B 5/055 | 324/318 |
| 2007/0170917 A1* | 7/2007 | Thompson | G01R 33/243 | 324/307 |
| 2010/0253352 A1* | 10/2010 | Hulbert | G01R 33/3415 | 324/318 |
| 2011/0044524 A1* | 2/2011 | Wang | G01R 33/54 | 382/131 |
| 2011/0169489 A1* | 7/2011 | Leussler | G01R 33/288 | 324/307 |
| 2011/0257515 A1* | 10/2011 | Atalar | A61B 5/055 | 600/422 |
| 2013/0076358 A1* | 3/2013 | Taracila | G01R 33/34084 | 324/322 |
| 2013/0113484 A1* | 5/2013 | Kumar | G01R 33/3628 | 324/318 |
| 2015/0022205 A1* | 1/2015 | Paul | G01R 33/543 | 324/309 |
| 2015/0035534 A1* | 2/2015 | Matschl | G01R 33/34015 | 324/318 |

* cited by examiner

METHOD AND DEVICE FOR CHECKING BODY COIL OF MAGNETIC RESONANCE IMAGING SYSTEM

BACKGROUND OF THE INVENTION

Field of the Invention

The present invention relates to the technical field of magnetic resonance imaging, in particular a method and device for checking a body coil of a magnetic resonance imaging system.

Description of the Prior Art

Magnetic resonance imaging (MRI) is a technology in which the phenomenon of magnetic resonance is utilized for the purpose of imaging. The basic principles of magnetic resonance are as follows. When an atomic nucleus contains a single proton, as is the case with the nuclei of the hydrogen atoms that are present throughout the human body, this proton exhibits spin motion and resembles a small magnet. Moreover, the spin axes of these small magnets lack a definite pattern, but when an external magnetic field is applied, the small magnets will be rearranged according to the magnetic force lines of the external magnetic field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis, the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

In an MRI system, a body coil (BC) may develop an error due to a fault in e.g. a capacitor, PIN diode or PCB. When this error is not large, it cannot be detected by the MRI system, so the scanner will not stop operation because of such an error. However, an adjustment value of a BC with such an error may be different from the required value, and the scanning result will be affected.

In an MRI system, a maintenance engineer conducts a comprehensive check of the state of a BC by periodic quality inspections. If an error is found during such an inspection, the maintenance engineer will resolve the issue. Thus, in order to ensure that the MRI system is always in a normal operating state, the maintenance engineer must visit the site periodically (e.g. once every 6 months).

Specifically, the quality inspection items include: 1) BC tuning inspection: the maintenance engineer uses a device similar to a network analyzer to conduct a comprehensive scan of the system operating band, and any error in the BC can be detected by means of this tuning inspection; 2) BC coupling parameters; 3) coil transmission efficiency: the maintenance engineer uses a dedicated phantom setting to perform normal transmission adjustment; BC efficiency can be indicated by a coil power loss, which can be derived from a transmission adjustment result. However, quality inspection items need many items of hardware and software support, and cannot be implemented automatically during normal scanning by the system.

SUMMARY OF THE INVENTION

In view of the above, an object of the present invention is to provide a method for checking a body coil of an MRI system that includes, in an acquisition step, acquiring a current value of one or more parameters of the MRI system under a specific condition, and in a comparison step, comparing the current value with a reference value of the parameter to obtain a comparison result, and in a determining step, determining a state of the body coil according to the comparison result.

Preferably, the reference value is a value of the parameter of the body coil under the specific condition when installation of the MRI system is complete; or the reference value is a set value.

Preferably, the parameters are a reflection coefficient and a coupling coefficient between two or more said body coils of the MRI system.

Preferably, the specific condition is the body coil being in a tuned state, a patient table of the MRI system being outside an aperture of the MRI system, and a frequency range of the MRI system being +/−400 kHz.

Preferably, the comparison result is the difference between the current value and the reference value, and in the determining step, a state of the body coil is determined according to the relationship between the difference and a threshold.

Preferably, the method also includes a storing step, wherein the comparison result is stored and a change curve of the comparison result (change thereof over time) is formed, and a predicting step, wherein a state of the body coil is predicted according to the change curve.

Preferably, the predicting step includes determining that the body coil is in a faulty state if the change curve shows that the comparison result is steadily increasing or steadily decreasing or steadily fluctuating.

The present invention also provides a device for checking a body coil of an MRI system, having an acquisition scanner, for acquiring a current value of one or more parameters of the MRI system under a specific condition, a comparator, for comparing the current value with a reference value of the parameter to obtain a comparison result and a determining processor, for determining a state of the body coil according to the comparison result.

Preferably, the reference value is a value of the parameter of the body coil under the specific condition when installation of the MRI system is complete, or the reference value is a set value.

Preferably, the parameters are a reflection coefficient and a coupling coefficient between two or more said body coils of the MRI system.

Preferably, the specific condition is the body coil being in a tuned state, a patient table of the MRI system being outside an aperture of the MRI system, and a frequency range of the MRI system being +/−400 kHz.

Preferably, the comparison result is the difference between the current value and the reference value, and the determining unit is used for determining a state of the body coil according to the relationship between the difference and a threshold.

Preferably, the system also includes a memory, in which the comparison result is stored and a change curve is formed and a prediction processor, for predicting a state of the body coil according to the change curve.

Preferably, the prediction processor is used for determining that the body coil is in a faulty state if the change curve shows that the comparison result is steadily increasing or steadily decreasing or steadily fluctuating.

The method for checking a body coil of an MRI system according to a particular embodiment of the present invention can replace onsite periodic maintenance inspection by a maintenance engineer (lowering costs and increasing utilization rate), and also detect damage to the body coil at an early stage (the method for checking a body coil of an MRI system according to a first particular embodiment of the present invention can check the body coil frequently (e.g. each day), to check each change of the body coil, and find potential problems at an early stage).

DESCRIPTION OF THE PREFERRED EMBODIMENTS

The present invention is explained in further detail below by particular embodiments, to clarify the object, technical solution and advantages of the present invention.

Figure 1:
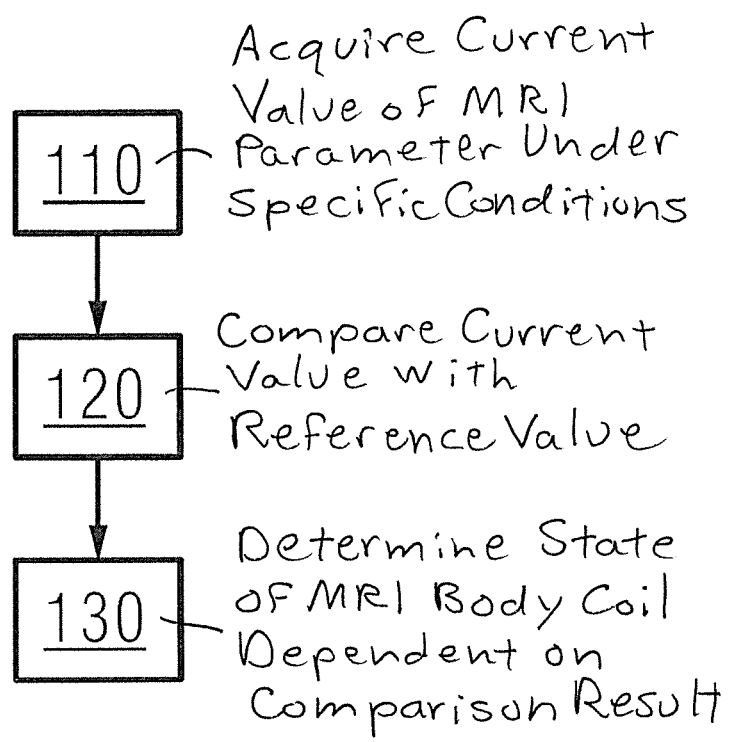
FIG. 1 is a flowchart of the steps of the method for checking a body coil of an MRI system according to a first embodiment of the present invention.

FIG. 1 is a flowchart of the steps of the method for checking a body coil of an MRI system according to a first embodiment of the present invention. As FIG. 1 shows, the method for checking a body coil of an MRI system according to the first embodiment of the present invention has an acquisition step 110, wherein a current value of one or more parameters of the MRI system under a specific condition. The method also includes a comparison step 120, wherein the current value is compared with a reference value of the parameter to obtain a comparison result, wherein the reference value is a value of the parameter of the body coil under the specific condition when installation of the MRI system is complete. The method has a determining step 130, wherein a state of the body coil is determined according to the comparison result.

Specifically, the parameters comprise a reflection coefficient and a coupling coefficient between two or more said body coils of the MRI system.

Before the method for checking a body coil of an MRI system according to a first embodiment of the present invention, i.e. when installation of the body coil and tuning of the body coil are finished, and the patient table is located outside the aperture of the MRI system, the above parameters of the body coil are measured; the above parameters can reflect a tuned state of the body coil. The measurement result for the above parameters at this time is used as a reference value. Preferably, the above measurement covers a complete frequency range of the MRI system, generally a center frequency +/−400 kHz; for example, measurement is carried out separately at frequencies such as center frequency+400 kHz, center frequency+300 kHz, center frequency+200 kHz, center frequency+100 kHz, center frequency, center frequency −100 kHz, center frequency −200 kHz, center frequency −300 kHz, and center frequency −400 kHz.

As stated above, the specific condition is the body coil being in a tuned state, the patient table of the MRI system being outside the aperture of the MRI system, and the frequency range of the MRI system being +/−400 kHz. The specific condition may also be other restrictions, as long as the specific condition for measuring the reference value is the same as the specific condition for measuring the current value. The reference value may also be a set value based on experience.

Furthermore, the comparison result is the difference between the current value and the reference value, and in the determining step, a state of the body coil is determined according to the relationship between the difference and a threshold. Specifically, if the difference is greater than the threshold then it is determined that the body coil is in a faulty state; if the difference is less than or equal to the threshold then it is determined that the body coil is in a good state.

Thus, the method for checking a body coil of an MRI system according to a first particular embodiment of the present invention can be performed without a maintenance engineer. For example, the method for checking a body coil of an MRI system according to the present invention can be performed each time the MRI system is turned on or whenever the time period for which the patient table is moved out of the aperture of the MRI system is longer than a pre-defined interval (e.g. 20 minutes).

The method for checking a body coil of an MRI system according to the first embodiment of the present invention can replace onsite periodic maintenance inspection by a maintenance engineer (lowering costs and increasing utilization rate), and also detect damage to the body coil at an early stage (the method for checking a body coil of an MRI system according to a first particular embodiment of the present invention can check the body coil frequently (e.g. each day), to check each change of the body coil, and find potential problems at an early stage).

Figure 2:
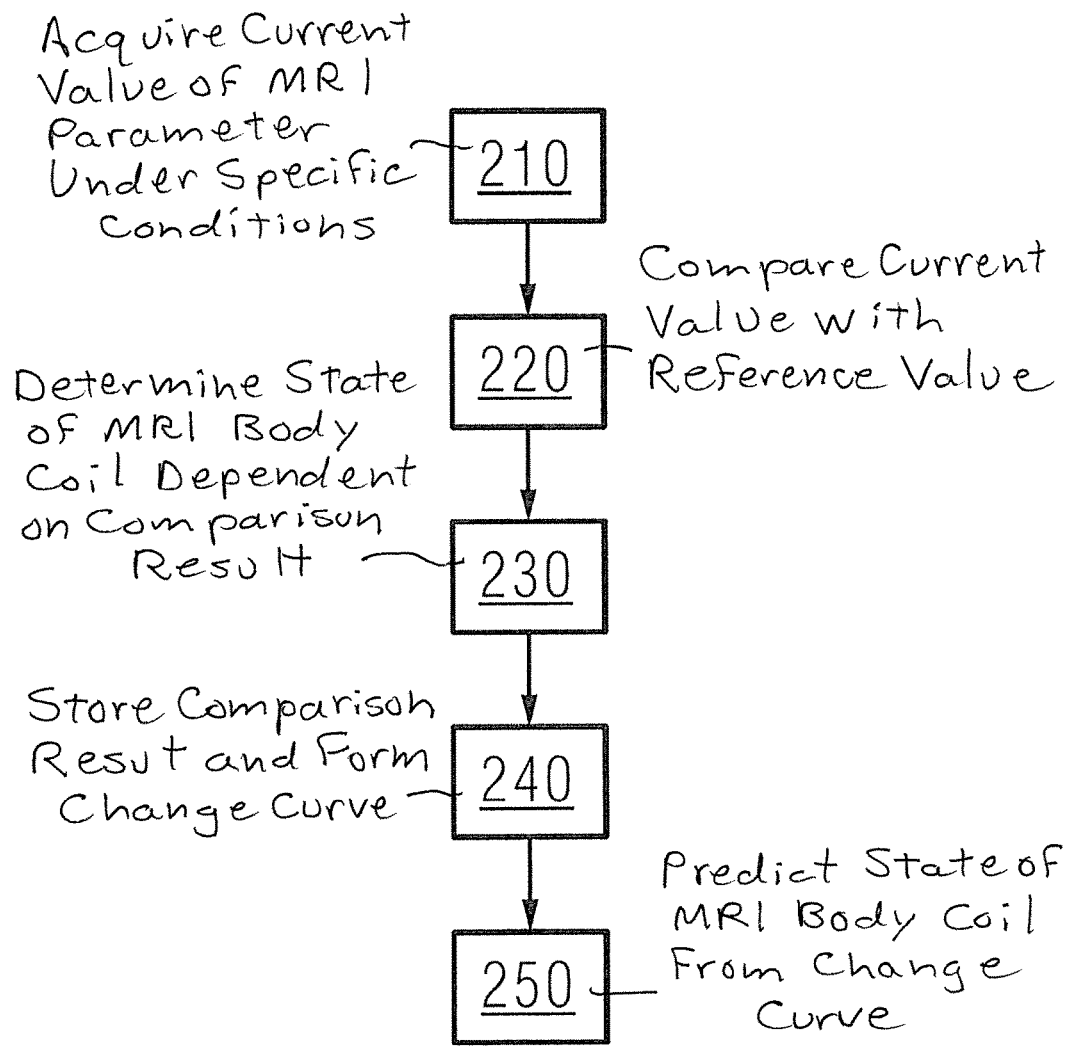
FIG. 2 is a flowchart of the steps of the method for checking a body coil of an MRI system according to a second embodiment of the present invention.

FIG. 2 is a flowchart of the steps of the method for checking a body coil of an MRI system according to a second embodiment of the present invention. As FIG. 2 shows, the method for checking a body coil of an MRI system according to the second embodiment of the present invention includes the method for checking a body coil of an MRI system according to the first embodiment of the present invention, i.e.: an acquisition step 210 wherein a current value of one or more parameters of the MRI system is acquired under a specific condition, a comparison step 220 wherein the current value is compared with a reference value of the parameter to obtain a comparison result, wherein the reference value is a value of the parameter of the body coil under the specific condition when installation of the MRI system is complete and a determining step 230, wherein a state of the body coil is determined according to the comparison result. The method for checking a body coil of an MRI system according to the second embodiment of the present invention also has a storing step 240 wherein the comparison result is stored and a change curve thereof is formed, and a predicting step 250 wherein a state of the body coil is predicted according to the change curve.

Specifically, if the change curve shows that the current value is steadily increasing or steadily decreasing or steadily fluctuating, then it can be determined that the body coil is in a faulty state.

Experimental Data

The frequency range of the MRI system is set to be 127.2 MHz +/−400 kHz. When the patient table is moved out of the body coil, the reflection coefficient and coupling coefficient of the body coil will be measured for each 1.0 kHz interval in the defined frequency range. The results are filed in a tuning value database.

Defined thresholds:
Reflection coefficient S11/S22:
Threshold for tuning value:
Reflection: <0.15
Phase: <20 deg
Coupling coefficient S21:
Test result: <−15 dB
Standard tuning BC tuning results at 127.2 MHz +/−400 KHz:
S11: 0.60 (50 deg)
S22: 0.61 (47 deg)
S21: −19.2 dB (minimum at 127.2 MHz +/−400 KHz)
Under a test at 127.352 MHz. The following BC tuning results are obtained:
S11: 0.70 (75 deg)
S22: 0.48 (30 deg)
S21: −12 dB (minimum at 127.2 MHz +/−400 KHz)
The difference is outside the defined threshold. Therefore the system reports an error, shuts down and awaits maintenance.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for checking a body coil that transmits and receives radio-frequency (RF) signals in a magnetic resonance imaging (MRI) system having a patient table and an MRI measurement volume, said method comprising:
    operating said MRI system with said body coil under predetermined conditions that comprise tuning said body coil so as to put said body coil in a tuned state with said patient table outside of said MRI measurement volume, and with said MRI system in a predetermined frequency range between +400 kHz and −400 kHz;
    while said MRI system is operated under said predetermined conditions, acquiring a current value of a parameter, which represents operation of said body coil under said predetermined conditions, as a reflection coefficient and a coupling coefficient between at least two body coils of said MRI system;
    providing said current value of said parameter to a computer and, in said computer, comparing said current value of said parameter to a reference value of said parameter, said reference value being selected from the group consisting of a value of said parameter exhibited by said body coil at a time of installation of said MRI system, and a value of said parameter that is set after said time of installation, in order to obtain a comparison result; and
    in said computer, determining a state of said body coil dependent on a relationship of said comparison result to a threshold value, and emitting an electronic signal from the computer that represents the determined state of the body coil.

2. A method as claimed in claim 1 comprising implementing said comparison to determine, as said comparison result, a difference between said current value and said reference value, and determining said state of said body coil dependent on a relationship between said difference and said threshold.

3. A method as claimed in claim 1 comprising storing the comparison result and forming a change curve thereof that represents a change of said comparison result over time, and, in said computer, executing a predicting algorithm to predict a state of the body coil according to said change curve.

4. A method as claimed in claim 3 comprising determining, in said computer, that said body coil is in a faulty state if said change curve shows that said comparison result is steadily increasing or steadily decreasing or steadily fluctuating.

5. A magnetic resonance imaging (MRI) system, comprising:
    a body coil that transmits and receives radio-frequency (RF) signals into and from an MRI measurement volume of the MRI system;
    a patient table that is movable into and out of said MRI measurement volume;
    a computer configured to operate said MRI system with said body coil under predetermined conditions that comprise tuning said body coil so as to put said body coil in a tuned state with said patient table outside of said MRI measurement volume, and with said MRI system in a predetermined frequency range between +400 kHz and −400 kHz;
    said computer being configured to receive, while said MRI system is operated under said predetermined conditions, acquiring a current value of a parameter, which represents operation of said body coil under said predetermined conditions, as a reflection coefficient and a coupling coefficient between at least two body coils of said MRI systems;
    said computer being configured to compare said current value of said parameter to a reference value of said parameter, said reference value being selected from the group consisting of a value of said parameter exhibited by said body coil at a time of installation of said MRI system, and a value of said parameter that is set after said time of installation, in order to obtain a comparison result; and
    said computer being configured to determine a state of said body coil dependent on a relationship of said comparison result to a threshold value, and to emit an electronic signal from the computer that represents the determined state of the body coil.

6. A device as claimed in claim 5 wherein said control computer is configured to implement said comparison to determine, as said comparison result, a difference between said current value and said reference value, and determining said state of said body coil dependent on a relationship between said difference and a threshold.

7. A device as claimed in claim 5 wherein said control computer is configured to store the comparison result and forming a change curve thereof that represents a change of said comparison result over time, and to execute a predicting algorithm to predict a state of the body coil according to said change curve.

8. A device as claimed in claim 7 wherein said control computer is configured to determine that said body coil is in a faulty state if said change curve shows that said comparison result is steadily increasing or steadily decreasing or steadily fluctuating.

* * * * *